United States Patent
Preissel et al.

(10) Patent No.: US 10,979,056 B2
(45) Date of Patent: Apr. 13, 2021

(54) DITHERING FOR SPUR REDUCTION IN LOCAL OSCILLATOR GENERATION

(71) Applicant: INTEL IP CORPORATION, Santa Clara, CA (US)

(72) Inventors: Christoph S. Preissel, Linz (AU); Peter Preyler, Weyer (AU); Thomas Mayer, Linz (AU)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/646,746

(22) PCT Filed: Sep. 12, 2017

(86) PCT No.: PCT/US2017/051058
§ 371 (c)(1),
(2) Date: Mar. 12, 2020

(87) PCT Pub. No.: WO2019/054981
PCT Pub. Date: Mar. 21, 2019

(65) Prior Publication Data
US 2020/0280318 A1    Sep. 3, 2020

(51) Int. Cl.
*H03L 7/081*    (2006.01)
*G06F 1/025*    (2006.01)
*H03L 7/07*     (2006.01)
*H03L 7/16*     (2006.01)

(52) U.S. Cl.
CPC ............ *H03L 7/0814* (2013.01); *G06F 1/025* (2013.01); *H03L 7/07* (2013.01); *H03L 7/16* (2013.01)

(58) Field of Classification Search
CPC . H03L 7/0814; H03L 7/07; H03L 7/16; G06F 1/025
See application file for complete search history.

(56) References Cited

U.S. PATENT DOCUMENTS

| | | | |
|---|---|---|---|
| 6,154,095 A | * | 11/2000 | Shigemori ........... H03K 3/0307 331/158 |
| 2015/0188583 A1 | | 7/2015 | Ravi et al. |
| 2016/0094237 A1 | | 3/2016 | Tertinek et al. |
| 2016/0182072 A1 | | 6/2016 | Preyler et al. |

OTHER PUBLICATIONS

International Search Report dated Jun. 29, 2018 for International Application No. PCT/US2017/051058.
International Preliminary Report on Patentability dated Mar. 26, 2020 for International Application No. PCT/US2017/051058.

* cited by examiner

*Primary Examiner* — Jung Kim
(74) *Attorney, Agent, or Firm* — Eschweiler & Potashnik, LLC

(57) ABSTRACT

Method, systems, and circuitries are provided for generating an output signal with reduced spurs by dithering. A method to generate an output signal having a desired frequency based on a reference signal having a reference frequency includes receiving a desired phase shift between a next cycle of the output signal with respect to a next cycle of the reference signal. A mapping between respective code words and phase shifts is read. A first codeword mapped to a first phase shift that is lower in value to the desired phase shift is identified. A second codeword mapped to a second phase shift that is higher in value to the desired phase shift is identified. The method includes selecting either the first codeword or the second codeword and generating the output signal based on the selected codeword.

18 Claims, 3 Drawing Sheets

DITHERING FOR SPUR REDUCTION IN LOCAL OSCILLATOR GENERATION

This application is a National Phase entry application of International Patent Application No. PCT/US2017/051058 filed Sep. 12, 2017 and is hereby incorporated by reference in its entirety.

BACKGROUND

Digital-to-time converters (DTCs) are an attractive solution for the generation of local oscillator (LO) signals in multi-standard transceivers because DTCs benefit from a digital design flow including the possibility of RF synthesis. DTCs are particularly advantageous in transceivers supporting downlink carrier aggregation (CA), where multiple LO signals can be generated by a single RF digital phase locked loop (DPLL) driving multiple DTCs. This use of a single DPLL to generate multiple LO signals saves chip area and avoids magnetic coupling issued experienced in multiple DPLL solutions.

DETAILED DESCRIPTION

Figure 1A:
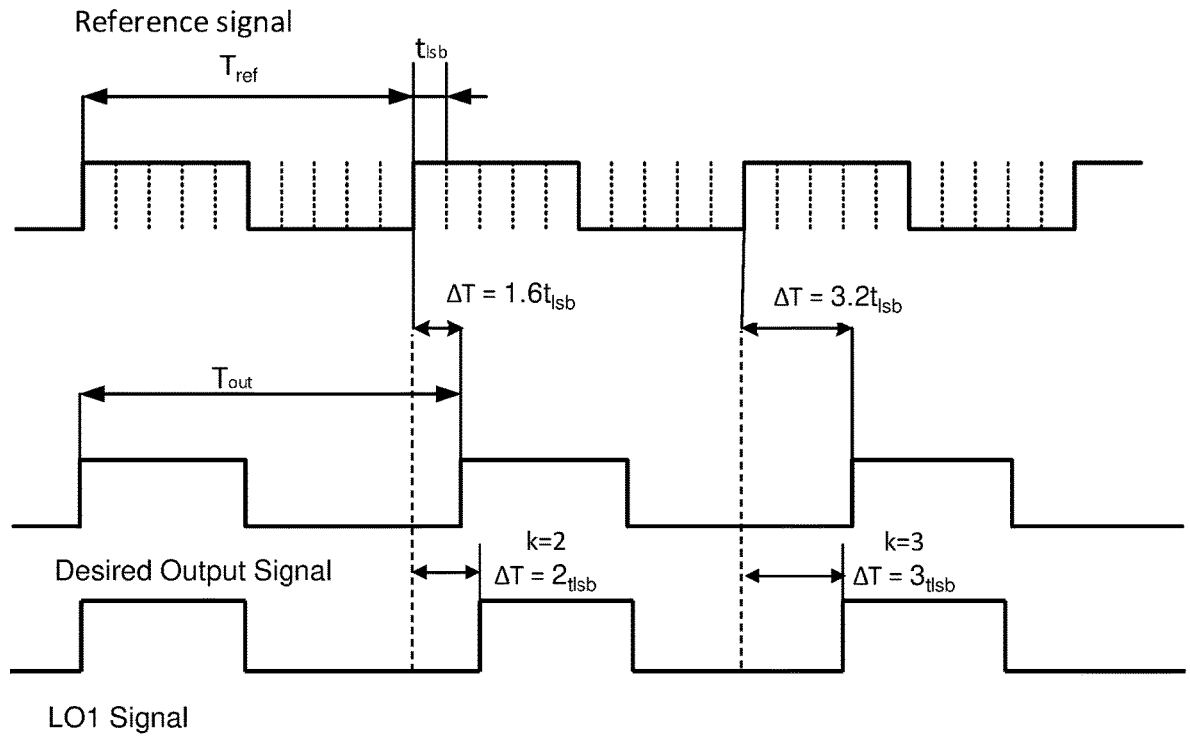
FIG. 1A illustrates how a digital output signal having a desired frequency can be generated with a DTC acting on a reference signal having a reference frequency different than the desired frequency.

FIG. 1A illustrates a digital reference signal having a reference frequency, a period $T_{ref}$, and a desired output signal having a period of $T_{out}$. The output signal is to be generated using a DTC that inputs the reference signal and outputs a modification of the reference signal in which the occurrence of a next edge (rising edges in FIG. 1A, but could also be falling edges) is delayed by some number of DTC delay steps. Each DTC delay step has a duration of $t_{lsb}$ (based on the bit resolution of the DTC). The number of delay steps by which the DTC delays a next edge is controlled by a codeword that is input to the DTC. For example, in the first cycle of the desired output signal, the rising edge is delayed by amount of time ($\Delta T$) of about 1.6 $t_{lsb}$. In the second cycle the rising edge is delayed by 3.2 $t_{lsb}$, and so on until the delay between the edge in the desired output signal and the reference signal returns to 1.6 $t_{lsb}$. It can be seen that the delay (e.g., phase shift $\varphi$) for each rising edge incrementally increases in a ramp-like fashion.

The signal generation system will be described herein in the context of generating an LO signal. However, the described dithering techniques can be equally applicable to any signal generation system that might be susceptible to quantization error and/or error due to nonlinearities of a DTC.

Figure 1B:
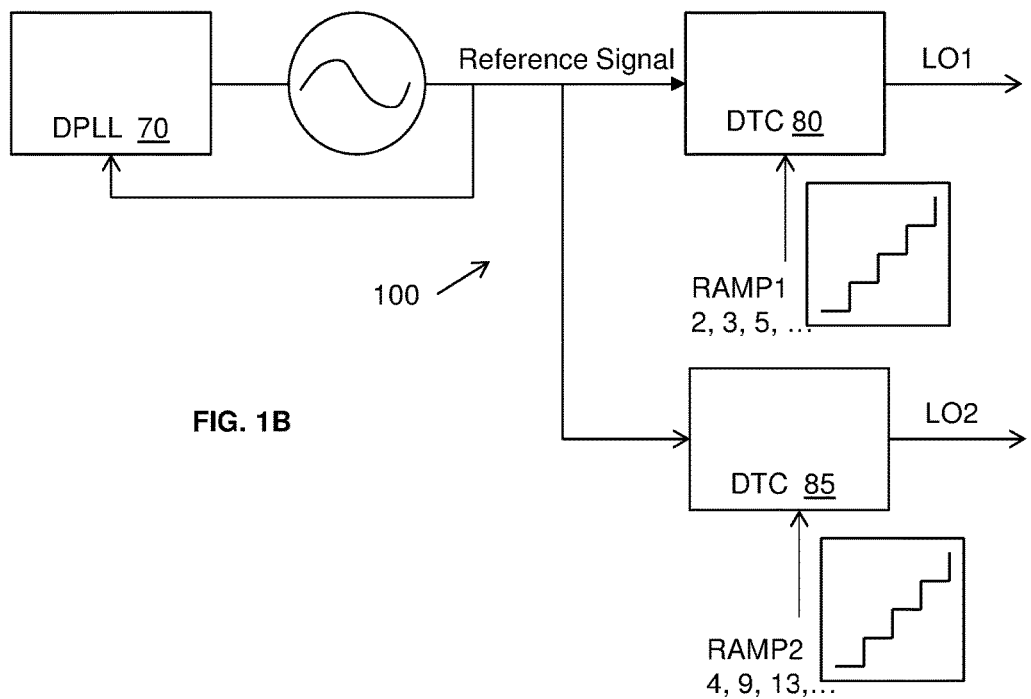
FIG. 1B illustrates a single DPLL generating two different LO signals using two DTCs.

FIG. 1B illustrates an exemplary LO signal generation system 100 that includes a DPLL 70 that generates a reference signal that corresponds to the reference signal of FIG. 1A. Two DTCs 80, 85 input the reference signal and, as controlled by codeword ramps RAMP1 and RAMP2, output LO signals LO1 and LO2, respectively. The codeword ramps are each a series of codewords that correspond to a quantization of the desired phase shifts of each edge in the desired output signal. It can be seen that RAMP1 delays the edges by fewer delay steps per increment than RAMP2, meaning that LO1 is closer in frequency to the reference frequency than LO2.

A first DTC 80 inputs the reference signal and, as described above, outputs LO1 by delaying each edge of the reference signal by an incrementally increasing number of delay steps. The first codeword ramp RAMP1 is a series of codewords that correspond to a quantization of the desired phase shifts (e.g., 1.6 $t_{lsb}$, 3.2 $t_{lsb}$, and so on) of each edge in the desired output signal. Due to the resolution of the DTC, it is not possible for the DTC to delay the rising edge by exactly 1.6 $t_{lsb}$ as in the desired output signal. Rather, the DTC can either delay the rising edge by 1 $t_{lsb}$ or 2 $t_{lsb}$, which are the codewords on either side of the desired phase shift. In other words, codeword 1 is a codeword mapped to a phase shift value less than the desired phase shift while codeword 2 is a codeword mapped to a phase shift value greater than the desired phase shift. Assuming the closest codeword "k" to 1.6 $t_{lsb}$ (i.e., k=2) that causes the DTC to delay by 2 $t_{lsb}$ is chosen, it can be seen in FIG. 1A that in the first cycle, the rising edge of the LO1 signal will occur later than the corresponding edge in the desired output signal edge. In the second cycle, codeword 3 is selected and the rising edge of the LO1 signal will occur earlier than the corresponding edge in the desired output signal edge. This "quantization error" causes spurs in the LO signal.

Some LO signal generation systems employ "additive dithering" to address the issue of quantization error. When a DTC is used for LO generation, the input signal to the DTC is a periodic code ramp (see FIG. 2) which leads to periodic edge location errors in the time domain causing quantization spurs in the output spectrum. In additive dithering, the phase shift value is increased or decreased by some amount range prior to its quantization into a codeword. In uniform additive dithering, a random value that is added or subtracted from each phase shift value is selected from numbers uniformly distributed in some. In the example of FIG. 1A, using uniform additive dithering could change 1.6 $t_{lsb}$ to 1.4 $t_{lsb}$ and 3.2 $t_{lsb}$ to 3.3 $t_{lsb}$, meaning that codewords 1 and 3 would be selected instead of codewords 2 and 3. Due to the random code selection this type of dithering is able to break the periodicity of the quantization-induced spurs and the output spectrum becomes white. The mitigation of the quantization spurs comes at the cost of an increased noise floor.

Another source of spurs in the LO signal is due to nonlinearities in the DTC devices that causes the relationship between codewords and the amount of delay produced by the DTC to be nonlinear. This nonlinearity introduces periodic spurs into the LO signal. Additive dithering does not address spurs in the LO signal due to nonlinearities in the DTC.

Described herein are systems, circuitries, and methods that utilize a unique dithering approach that compensates for both quantization error and errors due to DTC nonlinearities. The systems, circuitries, and methods perform this compensation without using additive dithering to modify the phase shift value prior to quantization. The described systems, circuitries, and methods use the knowledge of the nonlinearity of the DTC during dithering to select codewords randomly in such a way that spurs due to quantization as well as spurs due to nonlinearities are mitigated.

Figure 2:
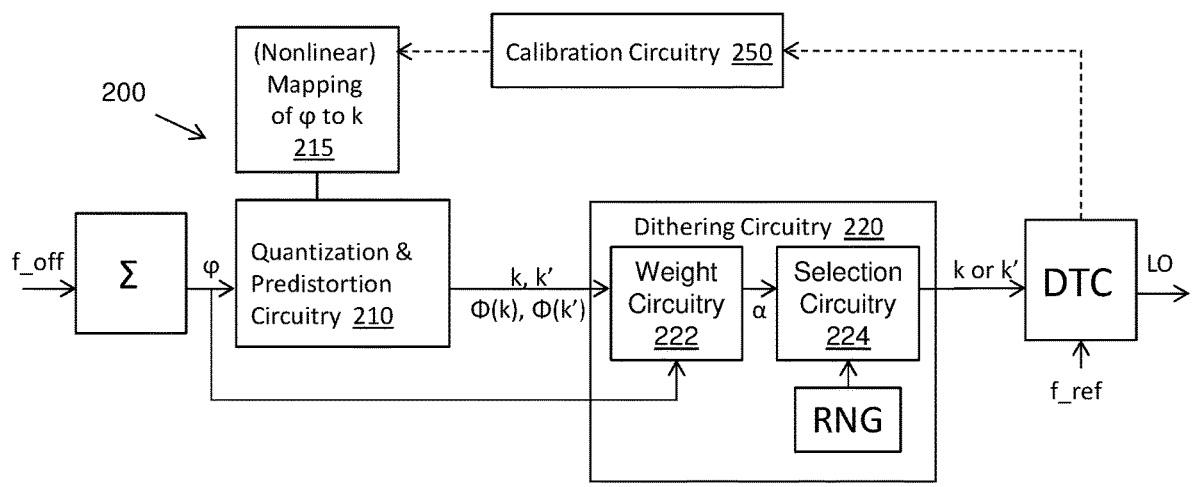
FIG. 2 illustrates an exemplary LO signal generation system in accordance with various aspects described.

FIG. 2 illustrates an exemplary signal generation system 200 that includes a DTC and dithering circuitry 220 configured to reduce or eliminate spurs induced in an LO signal due to quantization error and DTC nonlinearities. The system 200 includes a phase accumulator that accumulates a frequency offset corresponding to a difference between the desired LO signal frequency and a reference frequency. The phase accumulator generates a desired phase shift φ, which is the amount of time that the next edge of the reference signal should be delayed to obtain the desired LO signal. In the example of FIG. 1A, the first phase shift is 1.6 $t_{lsb}$ and the second phase shift is 3.2 $t_{lsb}$.

A quantization and predistortion circuitry 210 quantizes the phase shift φ by reading a mapping of phase shift to DTC codeword (k) 215. The quantization and predistortion circuitry 210 identifies at least two codewords based on the phase shift φ. A first codeword k is identified that is mapped to a phase shift that is less than the phase shift φ and a second codeword k' is identified that is mapped to a phase shift that is greater than the phase shift φ. Note that the phase shift φ is not modified prior to the quantization, as it would be in additive dithering. More than two codewords could be identified as long as one of the identified codewords is mapped to a phase shift that is less than the phase shift φ and one of the identified codewords is mapped to a phase shift that is greater than the phase shift φ.

Figure 3:
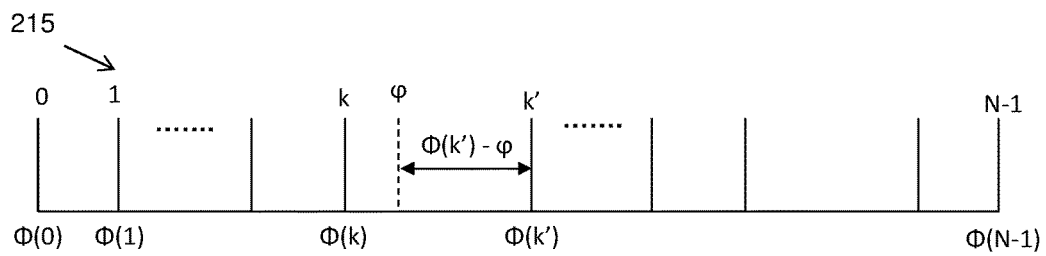
FIG. 3 illustrates a codeword selection process utilized by the LO signal generation system of FIG. 2.

The mapping of phase shift to codeword 215 is generated by calibration circuitry 250 during a training phase for the DTC. During the training phase, the calibration circuitry 250 measures and stores an amount of phase shift that is generated by the DTC in response to each codeword. In this manner, any nonlinearities in the DTC may be captured and reflected in the mapping of phase shift to codeword 215. In other words, the mapping incorporates knowledge (gained by the calibration circuitry 250) about DTC nonlinearities for every possible codeword by mapping every possible codeword to its "actual" resulting phase shift φ(k). Referring to FIG. 3, an exemplary nonlinear mapping of phase shift to codeword 215 is illustrated. It can be seen that the change in phase shift between codewords is not constant.

The quantization and predistortion circuitry 210 outputs the first codeword and the second codeword as well as the phase shift value φ(k) mapped to the first codeword and the phase shift value φ(k') mapped to the second codeword to the dithering circuitry 220. The dithering circuitry 220 selects one of the codewords and provides the codeword to the DTC for use in delaying a next edge of a reference signal (not shown, see FIG. 1A) to generate the LO signal. In one example the dithering circuitry 220 includes weight circuitry 222 and selection circuitry 224. The weight circuitry 222 calculates a weight α as follows:

$$\alpha = \frac{\varphi(k') - \varphi(\text{desired})}{\varphi(k') - \varphi(k)} \qquad \text{EQ. 1}$$

The weight circuitry 222 provides the calculated weight to the selection circuitry 224, which compares the weight to a random number in the interval [0,1] that is generated by a random number generator (RNG). If the random number is smaller than the weight, the selection circuitry 224 selects codeword k. Otherwise the selection circuitry 224 selects codeword k'. Using this codeword selection technique, the mean value of the edge that is output by the DTC matches the desired phase shift φ. Furthermore, due to the random codeword selection implemented by selection circuitry 224, the output spectrum becomes white.

Figure 4:
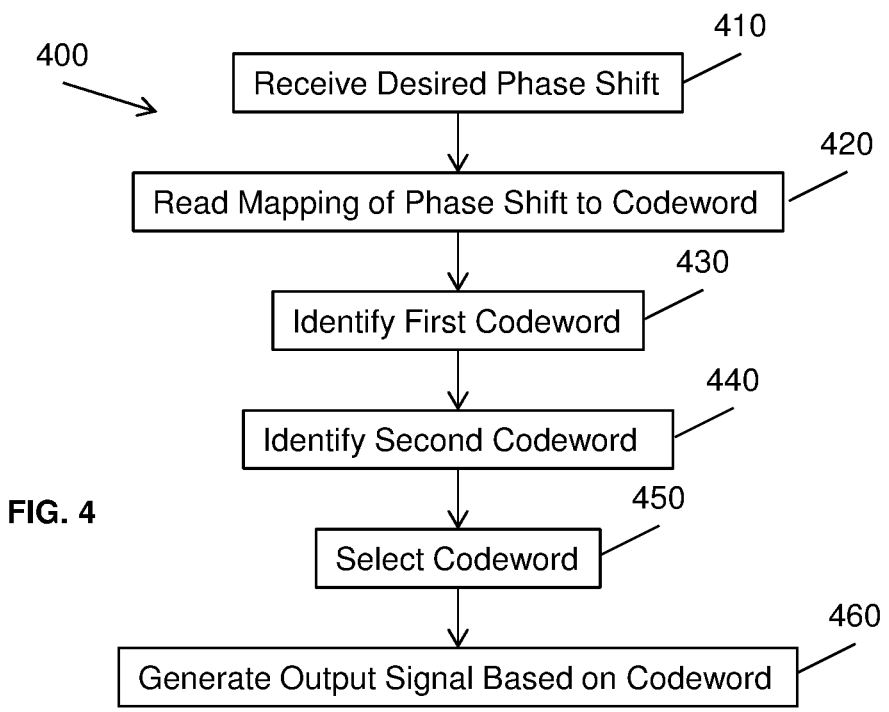
FIG. 4 illustrates a flow diagram of an exemplary method for generating an LO signal in accordance with various aspects described.

FIG. 4 illustrates a flow diagram outlining one embodiment of a method 400 to generate an output signal having a desired frequency based on a reference signal having a reference frequency. The method 400 may be performed, for example, by the quantization and predistortion circuitry 210 and/or dithering circuitry 220 of FIG. 2. The method includes, at 410, receiving a desired phase shift between a next cycle of the output signal with respect to a next cycle of the reference signal. At 420, the method includes reading a mapping between respective code words and phase shifts. At 430, a first codeword is identified that is mapped to a first phase shift that is lower in value to the desired phase shift. At 440, a second codeword is identified that is mapped to a second phase shift that is higher in value to the desired phase shift. The method includes, at 450 selecting either the first codeword or the second codeword. At 460, the output signal is generated (e.g., by a DTC) based on the selected codeword.

It can be seen from the foregoing description that the dithering techniques disclosed herein not only eliminate spurs due to quantization error and DTC nonlinearities but also provide predistortion for the DTC so that a more accurate LO signal may be generated.

Figure 5:
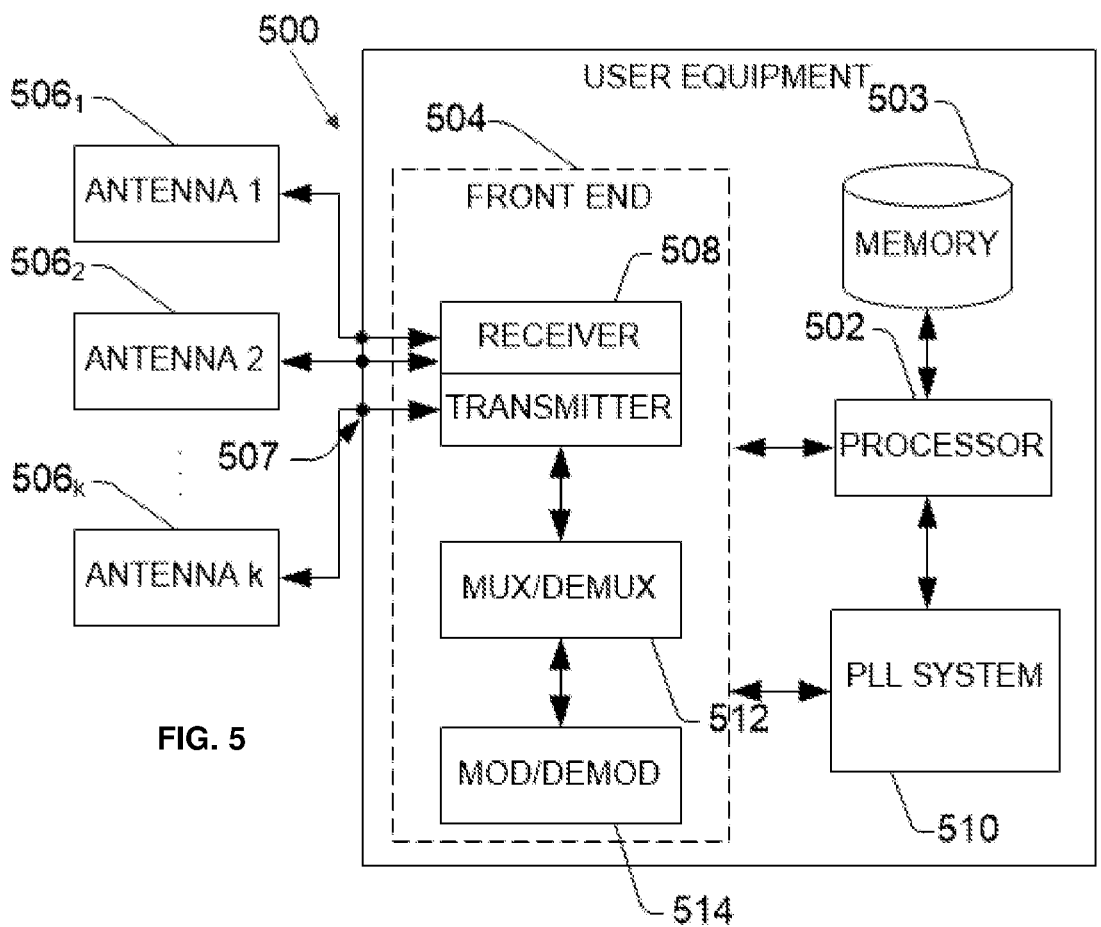
FIG. 5 illustrates an example user equipment device that includes an LO signal generation system in accordance with various aspects described.

To provide further context for various aspects of the disclosed subject matter, FIG. 5 illustrates a block diagram of an embodiment of user equipment 500 (e.g., a mobile device, communication device, personal digital assistant, etc.) related to access of a network (e.g., base station, wireless access point, femtocell access point, and so forth) that can enable and/or exploit features or aspects of the disclosed aspects.

The user equipment or mobile communication device 500 can be utilized with one or more aspects of the LO signal generation systems described herein according to various aspects. The user equipment device 500, for example, comprises a digital baseband processor 502 that can be coupled to a data store or memory 503, a front end 504 (e.g., an RF front end, an acoustic front end, or the other like front end) and a plurality of antenna ports 507 for connecting to a plurality of antennas $506_1$ to $506_k$ (k being a positive integer). The antennas $506_1$ to $506_k$ can receive and transmit signals to and from one or more wireless devices such as access points, access terminals, wireless ports, routers and so forth, which can operate within a radio access network or other communication network generated via a network device (not shown).

The user equipment 500 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 504 can include a communication platform, which comprises electronic components and associated circuitry that provide for processing, manipulation or shaping of the received or transmitted signals via one or more receivers or transmitters (e.g. transceivers) 508, a mux/demux component 512, and a mod/demod component 514. The front end 504 is coupled to the digital baseband processor 502 and the set of antenna ports 507, in which the set of antennas 5061 to 506k can be part of the front end. In one aspect, the user equipment device 500 can comprise a phase locked loop system 510.

The processor 502 can confer functionality, at least in part, to substantially any electronic component within the mobile communication device 500, in accordance with aspects of the disclosure. As an example, the processor 502 can be configured to execute, at least in part, executable instructions that select a codeword to control a DTC and/or determine and store codewords mapped to phase shifts generated by the DTC. Thus the processor 502 may embody various aspects of the calibration circuitry 250 and/or dithering circuitry 220 of FIG. 2.

The processor 502 is functionally and/or communicatively coupled (e.g., through a memory bus) to memory 503 in order to store or retrieve information necessary to operate and confer functionality, at least in part, to communication platform or front end 504, the phase locked loop system 510 and substantially any other operational aspects of the phase locked loop system 510. The phase locked loop system 510 includes at least one oscillator (e.g., a VCO, DCO or the like) that can be calibrated via core voltage, a coarse tuning value, signal, word or selection process as described herein.

The processor 502 can operate to enable the mobile communication device 500 to process data (e.g., symbols, bits, or chips) for multiplexing/demultiplexing with the mux/demux component 512, or modulation/demodulation via the mod/demod component 514, such as implementing direct and inverse fast Fourier transforms, selection of modulation rates, selection of data packet formats, inter-packet times, etc. Memory 503 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation. Memory 503 may include a static random access memory (SRAM) or dynamic RAM that stores a nonlinear mapping of phase shift to codeword (215 in FIG. 2) for use by quantization and predistortion circuitry 210 and calibration circuitry 250 of FIG. 2.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a method to generate an output signal having a desired frequency based on a reference signal having a reference frequency. The method includes receiving a desired phase shift between a next cycle of the output signal with respect to a next cycle of the reference signal; reading a mapping between respective code words and phase shifts; identifying a first codeword mapped to a first phase shift that is lower in value to the desired phase shift; identifying a second codeword mapped to a second phase shift that is higher in value to the desired phase shift; selecting either the first codeword or the second codeword; and generating the output signal based on the selected codeword.

Example 2 includes the subject matter of example 1, including or omitting any optional elements, further including providing the selected codeword to a digital-to-time converter that generates the output signal based on the selected codeword and the reference signal.

Example 3 includes the subject matter of example 1, including or omitting any optional elements, further including: determining the mapping by measuring an actual phase shift between the reference signal and an output signal generated by a DTC in response to a given codeword; and storing the given codeword mapped to the actual phase shift in memory for use in generating the output signal.

Example 4 includes the subject matter of example 1, including or omitting any optional elements, wherein the mapping between respective codewords and respective phase shifts is nonlinear.

Example 5 includes the subject matter of examples 1-4, including or omitting any optional elements, further including selecting either the first codeword or the second codeword with a probability that is based on a first difference between the first phase shift and the desired phase shift and a second difference between the second phase shift and the desired phase shift.

Example 6 includes the subject matter of examples 1-4, including or omitting any optional elements, further including selecting either the first codeword or the second codeword by: calculating a weight based on a ratio of a difference between the desired phase shift and one of the first phase shift or second phase shift and a difference between the first phase shift and the second phase shift; generating a random number; comparing the random number to the weight; and selecting either the first codeword or the second codeword based on a result of the comparison.

Example 7 includes the subject matter of examples 1-4, including or omitting any optional elements, further including receiving the desired phase shift from a phase accumulator that accumulates a frequency offset value corresponding to a difference between the desired frequency and the reference frequency, such that the output of the phase accumulator is not adjusted prior to the identifying of the first and second codewords.

Example 8 includes the subject matter of examples 1-4, including or omitting any optional elements, including: identifying, as the first codeword, a codeword mapped to a phase shift that is closest in value to the desired phase shift and lower in value than the desired phase shift; and identifying, as the second codeword, a codeword mapped to a phase shift that is closest in value to the desired phase shift and higher in value than the desired phase shift.

Example 9 includes the subject matter of examples 1-4, including or omitting any optional elements, further including: identifying one or more additional codewords mapped to respective phase shifts that are proximate in value to the desired phase shift; and selecting either the first codeword, the second codeword, or one of the one or more additional codewords for use in generating the output signal.

Example 10 is a signal generation system, configured to generate an output signal having a desired frequency based on a reference signal having a reference frequency. The system includes quantization and predistortion circuitry and selection circuitry. The quantization and predistortion circuitry is configured to receive a desired phase shift between a next cycle of the output signal with respect to a next cycle of the reference signal; read a mapping between respective code words and phase shifts; identify a first codeword mapped to a first phase shift that is lower in value to the desired phase shift; and identify a second codeword mapped to a second phase shift that is higher in value to the desired phase shift. The selection circuitry is configured to: select either the first codeword or the second codeword; and provide the selected codeword for use in generating the output.

Example 11 includes the subject matter of example 10, including or omitting any optional elements, wherein the selection circuitry is configured to provide the selected codeword to a digital-to-time converter that generates the output signal based on the selected codeword and the reference signal.

Example 12 includes the subject matter of example 10, including or omitting any optional elements, further including calibration circuitry configured to: determine the mapping by measuring an actual phase shift between the reference signal and an output signal generated by a DTC in response to a given codeword; and store the given codeword mapped to the actual phase shift in memory for use in generating the output signal.

Example 13 includes the subject matter of example 10, including or omitting any optional elements, wherein the mapping between respective codewords and respective phase shifts is nonlinear.

Example 14 includes the subject matter of examples 10-14, including or omitting any optional elements, wherein the selection circuitry is configured to select either the first codeword or the second codeword with a probability that is based on a first difference between the first phase shift and the desired phase shift and a second difference between the second phase shift and the desired phase shift.

Example 15 includes the subject matter of examples 10-14, including or omitting any optional elements, further including weight circuitry configured to calculate a weight based on a ratio of a difference between the desired phase shift and one of the first phase shift or second phase shift and a difference between the first phase shift and the second phase shift, and wherein the selection circuitry is configured to select either the first codeword or the second codeword by: generating a random number; comparing the random number to the weight; and selecting either the first codeword or the second codeword based on a result of the comparison.

Example 16 includes the subject matter of examples 10-14, including or omitting any optional elements, further including a phase accumulator that accumulates a frequency offset value corresponding to a difference between the desired frequency and the reference frequency and outputs the desired phase shift to the quantization and predistortion circuitry, such that the phase shift that is output by the phase accumulator is not adjusted prior to being input to the quantization and predistortion circuitry.

Example 17 includes the subject matter of examples 10-14, including or omitting any optional elements, wherein the selection circuitry is configured to: identify, as the first codeword, a codeword mapped to a phase shift that is closest in value to the desired phase shift and lower in value than the desired phase shift; and identify, as the second codeword, a codeword mapped to a phase shift that is closest in value to the desired phase shift and higher in value than the desired phase shift.

Example 18 includes the subject matter of examples 10-14, including or omitting any optional elements, wherein the selection circuitry is configured to: identify one or more additional codewords mapped to respective phase shifts that are proximate in value to the desired phase shift; and select either the first codeword, the second codeword, or one of the one or more additional codewords for use in generating the output signal.

Example 19 is dithering circuitry including weight circuitry and selection circuitry. The weight circuitry is configured to: receive a desired phase shift, a plurality of codewords, and corresponding plurality of phase shifts generated by a DTC in response to the plurality of codewords; and for each codeword, calculate a weight based on a ratio of a difference between the desired phase shift and a first phase shift of the plurality of phase shifts and a difference between the first phase shift and a second phase shift of the plurality of phase shifts, wherein the first phase shift is lower than the desired phase shift and the second phase shift is higher than the desired phase shift. The selection circuitry is configured to: select one of the plurality of codewords based at least on the weight; and provide the selected codeword for use in generating an output signal.

Example 20 includes the subject matter of example 19, including or omitting any optional elements, wherein the selection circuitry is configured to select one of the plurality of codewords by: generating a random number; comparing the random number to the weights associated with each of the plurality of codewords; and selecting a codeword based on a result of the comparison.

Example 21 is an apparatus to generate an output signal having a desired frequency based on a reference signal having a reference frequency, including: means for receiving a desired phase shift between a next cycle of the output signal with respect to a next cycle of the reference signal; means for reading a mapping between respective code words and phase shifts; means for identifying a first codeword mapped to a first phase shift that is lower in value to the desired phase shift; means for identifying a second codeword mapped to a second phase shift that is higher in value to the desired phase shift; means for selecting either the first codeword or the second codeword; and means for generating the output signal based on the selected codeword.

Example 22 includes the subject matter of example 21, including or omitting any optional elements, wherein the mapping between respective codewords and respective phase shifts is nonlinear.

Example 23 includes the subject matter of example 21, including or omitting any optional elements, wherein the means for selecting is configured to select either the first codeword or the second codeword with a probability that is based on a first difference between the first phase shift and the desired phase shift and a second difference between the second phase shift and the desired phase shift.

Example 24 includes the subject matter of example 21, including or omitting any optional elements, further including: means for calculating a weight based on a ratio of a difference between the desired phase shift and one of the first phase shift or second phase shift and a difference between the first phase shift and the second phase shift. The means for selecting is configured to select either the first codeword or the second codeword by: generating a random number; comparing the random number to the weight; and selecting either the first codeword or the second codeword based on a result of the comparison.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may include one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method to generate an output signal having a desired frequency based on a reference signal having a reference frequency, comprising:
  receiving a desired phase shift between a next cycle of the output signal with respect to a next cycle of the reference signal;
  reading a mapping between respective code words and phase shifts;
  identifying a first codeword mapped to a first phase shift that is lower in value to the desired phase shift;
  identifying a second codeword mapped to a second phase shift that is higher in value to the desired phase shift;
  selecting either the first codeword or the second codeword; and
  generating the output signal based on the selected codeword.

2. The method of claim 1, further comprising providing the selected codeword to a digital-to-time converter that generates the output signal based on the selected codeword and the reference signal.

3. The method of claim 1, further comprising:
  determining the mapping by measuring an actual phase shift between the reference signal and an output signal generated by a digital-to-time converter in response to a given codeword; and
  storing the given codeword mapped to the actual phase shift in memory for use in generating the output signal.

4. The method of claim 1, wherein the mapping between respective codewords and respective phase shifts is nonlinear.

5. The method of claim 1, further comprising selecting either the first codeword or the second codeword with a probability that is based on a first difference between the first phase shift and the desired phase shift and a second difference between the second phase shift and the desired phase shift.

6. The method of claim 1, further comprising selecting either the first codeword or the second codeword by:
  calculating a weight based on a ratio of a difference between the desired phase shift and one of the first phase shift or second phase shift and a difference between the first phase shift and the second phase shift;
  generating a random number;
  comparing the random number to the weight; and
  selecting either the first codeword or the second codeword based on a result of the comparison.

7. The method of claim 1, further comprising receiving the desired phase shift from a phase accumulator that accumulates a frequency offset value corresponding to a difference between the desired frequency and the reference frequency, such that the output of the phase accumulator is not adjusted prior to the identifying of the first and second codewords.

8. The method of claim 1, comprising:
- identifying, as the first codeword, a codeword mapped to a phase shift that is closest in value to the desired phase shift and lower in value than the desired phase shift; and
- identifying, as the second codeword, a codeword mapped to a phase shift that is closest in value to the desired phase shift and higher in value than the desired phase shift.

9. The method of claim 1, further comprising:
- identifying one or more additional codewords mapped to respective phase shifts; and
- selecting either the first codeword, the second codeword, or one of the one or more additional codewords for use in generating the output signal.

10. A signal generation system, configured to generate an output signal having a desired frequency based on a reference signal having a reference frequency, the system comprising:
- quantization and predistortion circuitry configured to:
  - receive a desired phase shift between a next cycle of the output signal with respect to a next cycle of the reference signal;
  - read a mapping between respective code words and phase shifts;
  - identify a first codeword mapped to a first phase shift that is lower in value to the desired phase shift;
  - identify a second codeword mapped to a second phase shift that is higher in value to the desired phase shift; and
- selection circuitry configured to:
  - select either the first codeword or the second codeword; and
  - provide the selected codeword for use in generating the output.

11. The signal generation system of claim 10, wherein the selection circuitry is configured to provide the selected codeword to a digital-to-time converter that generates the output signal based on the selected codeword and the reference signal.

12. The signal generation system of claim 10, further comprising calibration circuitry configured to:
- determine the mapping by measuring an actual phase shift between the reference signal and an output signal generated by a digital-to-time converter in response to a given codeword; and
- store the given codeword mapped to the actual phase shift in memory for use in generating the output signal.

13. The signal generation system of claim 10, wherein the mapping between respective codewords and respective phase shifts is nonlinear.

14. The signal generation system of claim 10, wherein the selection circuitry is configured to select either the first codeword or the second codeword with a probability that is based on a first difference between the first phase shift and the desired phase shift and a second difference between the second phase shift and the desired phase shift.

15. The signal generation system of claim 10, further comprising weight circuitry configured to calculate a weight based on a ratio of a difference between the desired phase shift and one of the first phase shift or second phase shift and a difference between the first phase shift and the second phase shift, and wherein the selection circuitry is configured to select either the first codeword or the second codeword by:
- generating a random number;
- comparing the random number to the weight; and
- selecting either the first codeword or the second codeword based on a result of the comparison.

16. The signal generation system of claim 10, further comprising a phase accumulator that accumulates a frequency offset value corresponding to a difference between the desired frequency and the reference frequency and outputs the desired phase shift to the quantization and predistortion circuitry, such that the phase shift that is output by the phase accumulator is not adjusted prior to being input to the quantization and predistortion circuitry.

17. The signal generation system of claim 10, wherein the selection circuitry is configured to:
- identify, as the first codeword, a codeword mapped to a phase shift that is closest in value to the desired phase shift and lower in value than the desired phase shift; and
- identify, as the second codeword, a codeword mapped to a phase shift that is closest in value to the desired phase shift and higher in value than the desired phase shift.

18. The signal generation system of claim 10, wherein the selection circuitry is configured to:
- identify one or more additional codewords mapped to respective phase shifts; and
- select either the first codeword, the second codeword, or one of the one or more additional codewords for use in generating the output signal.

* * * * *